(12) United States Patent
Wang et al.

(10) Patent No.: US 11,502,222 B2
(45) Date of Patent: Nov. 15, 2022

(54) OPTOELECTRONIC SEMICONDUCTOR CHIP BASED ON A PHOSPHIDE COMPOUND SEMICONDUCTOR MATERIAL

(71) Applicant: OSRAM Opto Semiconductors GmbH, Regensburg (DE)

(72) Inventors: Xue Wang, Regensburg (DE); Markus Broell, Cork (IE)

(73) Assignee: OSRAM OLED GmbH, Regensburg (DE)

( * ) Notice: Subject to any disclaimer, the term of this patent is extended or adjusted under 35 U.S.C. 154(b) by 3 days.

(21) Appl. No.: 16/480,111

(22) PCT Filed: Jan. 23, 2018

(86) PCT No.: PCT/EP2018/051572
§ 371 (c)(1),
(2) Date: Jul. 23, 2019

(87) PCT Pub. No.: WO2018/138081
PCT Pub. Date: Aug. 2, 2018

(65) Prior Publication Data
US 2019/0386174 A1    Dec. 19, 2019

(30) Foreign Application Priority Data
Jan. 27, 2017   (DE) .......................... 102017101637.6

(51) Int. Cl.
*H01L 33/14*       (2010.01)
*H01L 21/02*       (2006.01)
*H01L 21/04*       (2006.01)

(52) U.S. Cl.
CPC ........ *H01L 33/14* (2013.01); *H01L 21/02115* (2013.01); *H01L 21/041* (2013.01)

(58) Field of Classification Search
CPC ... H01L 33/14; H01L 21/02115; H01L 21/041
(Continued)

(56) References Cited

U.S. PATENT DOCUMENTS 6,350,997 B1   2/2002   Saeki et al.
6,426,518 B1   7/2002   Shakuda et al.
(Continued)

FOREIGN PATENT DOCUMENTS

DE   10 2014 106 635 A1   11/2014
EP        2 903 027 A1     8/2015
(Continued)

OTHER PUBLICATIONS

Hsu, S., et al. "High-Performance AlGaInP/GaAs Light-Emitting Diodes with a Carbon-Doped GaP/Indum-Tin Oxide Contact Layer," *Japanese Journal of Applied Physics*, 47(9): pp. 7023-7025. 2008. https://www.researchgate.net/publication/239663712_High-Performance_AlGaInPGaAs_Light-Emitting_Diodes_with_a_Carbon-Doped_GaPIndium-Tin_Oxide_Contact_Layer.
(Continued)

*Primary Examiner* — Nduka E Ojeh
*Assistant Examiner* — Eric W Jones
(74) *Attorney, Agent, or Firm* — DLA Piper LLP (US)

(57) ABSTRACT

An optoelectronic semiconductor chip including a semiconductor layer sequence containing a phosphide compound semiconductor material, wherein the semiconductor layer sequence includes a p-type semiconductor region, an n-type semiconductor region and an active layer disposed between the p-type semiconductor region and the n-type semiconductor region, a current spreading layer including a transparent conductive oxide adjoining the p-type semiconductor region, and a metallic p-connection layer at least regionally adjoining the current spreading layer, wherein the p-type semiconductor region includes a p-contact layer adjoining the current spreading layer, the p-contact layer contains GaP doped with C, a C dopant concentration in the p-contact layer is at least $5 \cdot 10^{19}$ cm$^{-3}$, and the p-contact layer is less than 100 nm thick.

18 Claims, 3 Drawing Sheets

(58) Field of Classification Search
USPC .......................................................... 257/101
See application file for complete search history.

(56) References Cited

U.S. PATENT DOCUMENTS

| | | | |
|---|---|---|---|
| 8,344,414 B2 | 1/2013 | Nagatake et al. | |
| 10,044,005 B2 | 8/2018 | Meinhold et al. | |
| 2007/0045608 A1 | 3/2007 | Wang et al. | |
| 2007/0075319 A1* | 4/2007 | Konno | H01L 33/14 257/79 |
| 2012/0122258 A1 | 5/2012 | Nitta et al. | |
| 2013/0049034 A1 | 2/2013 | Lin | |
| 2013/0126920 A1 | 3/2013 | Sundgren et al. | |
| 2014/0077221 A1* | 3/2014 | Genei | H01L 33/0025 257/76 |
| 2014/0183588 A1* | 7/2014 | Tokunaga | H01L 33/60 257/98 |
| 2014/0319456 A1 | 10/2014 | Ikeda et al. | |
| 2015/0214427 A1 | 7/2015 | Fuhrmann et al. | |
| 2015/0349220 A1 | 12/2015 | Moon et al. | |
| 2016/0268777 A1* | 9/2016 | Wada | H01S 5/22 |
| 2017/0155017 A1* | 6/2017 | Ko | H01L 33/58 |

FOREIGN PATENT DOCUMENTS

| | | |
|---|---|---|
| EP | 2 950 355 A1 | 12/2015 |
| JP | 11-307810 A | 11/1999 |
| JP | 2004-103709 A | 4/2004 |
| JP | 2005-197293 A | 7/2005 |
| JP | 2011-40477 A | 2/2011 |
| JP | 2012-104677 A | 5/2012 |
| JP | 2013-524547 | 6/2013 |
| JP | 2013-243202 A | 12/2013 |
| JP | 2014-103242 A | 6/2014 |
| JP | 2014-216598 A | 11/2014 |

OTHER PUBLICATIONS

Tsai, T. et al. "On an AlGaInP Multiple Quantum Well Light-Emitting Diode with a Thin Carbon-Doped GaP Contact Layer Structure," *Journal of The Electrochemical Society*, 157(4): pp. H459-H462. 2010. https://www.researchgate.net/publication/274878916_On_an_AlGaOnP_Multiple_Quantum_Well_Light_Emitting_Diode_with_a_Thin_Carbon-Doped_GaP_Contact_Layer_Structure.

Notice of Reason for Refusal dated Sep. 1, 2020, of counterpart Japanese Application No. 2019-537265, with an English translation.

Decision to Grant a Patent dated Jul. 6, 2021, of counterpart Japanese Application No. 2019-537265, with an English translation.

The First Office Action dated Sep. 22, 2021, of counterpart Chinese Application No. 201880008951.X, with an English translation.

Notification of Reexamination dated Sep. 9, 2022, of counterpart Chinese Patent Application No. 201880008951.X, along with a machine translation.

* cited by examiner

OPTOELECTRONIC SEMICONDUCTOR CHIP BASED ON A PHOSPHIDE COMPOUND SEMICONDUCTOR MATERIAL

TECHNICAL FIELD

This disclosure relates to an optoelectronic semiconductor chip, in particular an optoelectronic semiconductor chip based on a phosphide compound semiconductor material.

BACKGROUND

In optoelectronic semiconductor chips such as light emitting diode chips, a comparatively thick current spreading layer of a semiconductor material with good electrical conductivity is usually arranged between the electrical contact and the light emitting semiconductor layer sequence to achieve as uniform a current flow as possible through the active layer.

An optoelectronic semiconductor chip in which the light-emitting region is based on a phosphide compound semiconductor is known from U.S. Pat. No. 6,426,518 B1, for example, where a current spreading layer composed of p-AlGaAs is arranged between the electrical contact and the light-emitting region. The current spreading layer is between 1 µm and 10 µm thick.

Comparatively thick current spreading layers of AlGaAs can achieve good current spreading, but on the other hand also a considerable proportion of the emitted radiation is absorbed. Absorption of a thick current spreading layer cannot be neglected, especially if the emitted radiation is short-wave and/or if the aluminium content in the current spreading layer is low. An increase in the aluminium content in the current spreading layer increases the sensitivity of the optoelectronic semiconductor chip to moisture.

It could therefore be helpful to provide an optoelectronic semiconductor chip characterized by low optical absorption and simultaneously low sensitivity to moisture.

SUMMARY

We provide an optoelectronic semiconductor chip including a semiconductor layer sequence containing a phosphide compound semiconductor material, wherein the semiconductor layer sequence includes a p-type semiconductor region, an n-type semiconductor region and an active layer disposed between the p-type semiconductor region and the n-type semiconductor region, a current spreading layer including a transparent conductive oxide adjoining the p-type semiconductor region, and a metallic p-connection layer at least regionally adjoining the current spreading layer, wherein the p-type semiconductor region includes a p-contact layer adjoining the current spreading layer, the p-contact layer contains GaP doped with C, a C dopant concentration in the p-contact layer is at least $5*10^{19}$ cm$^{-3}$, and the p-contact layer is less than 100 nm thick.

We also provide an optoelectronic semiconductor chip including a semiconductor layer sequence containing a phosphide compound semiconductor material, wherein the semiconductor layer sequence includes a p-type semiconductor region, an n-type semiconductor region and an active layer disposed between the p-type semiconductor region and the n-type semiconductor region, a current spreading layer including a transparent conductive oxide adjoining the p-type semiconductor region, and a metallic p-connection layer at least regionally adjoining the current spreading layer, wherein the p-type semiconductor region includes a p-contact layer adjoining the current spreading layer, the p-contact layer (7) contains GaP doped with C, a C dopant concentration in the p-contact layer is at least $5*10^{19}$ cm$^3$, the p-contact layer is less than 100 nm thick, an intermediate layer containing GaP doped with C is arranged on a side of the p-contact layer remote from the current spreading layer, the intermediate layer having a lower dopant concentration than the p-contact layer.

Figure 1:
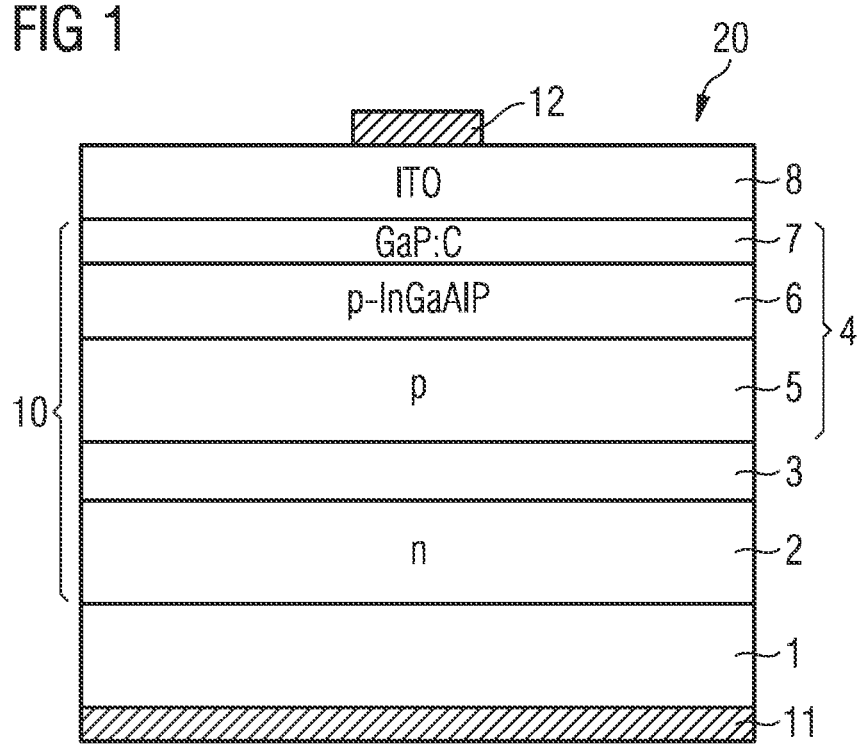
FIG. 1 shows a schematic representation of a cross-section through an optoelectronic semiconductor chip according to a first example.

REFERENCES 1 growth substrate
2 n-type semiconductor region
3 active layer
4 p-type semiconductor region
5 p-type semiconductor layer
6 p-InGaAlP layer
7 p-contact layer
8 current spreading layer
9 dielectric layer
10 semiconductor layer sequence
11 n-connection layer
12 p-connection layer
13 connection layer
14 carrier
15 intermediate layer
16a first layers
16b second layers
20 optoelectronic semiconductor chip

DETAILED DESCRIPTION

Our optoelectronic semiconductor chip may contain a semiconductor layer sequence based on a phosphide compound semiconductor material. "Based on a phosphide compound semiconductor material" means that one or more layers of the semiconductor layer sequence comprise a III-phosphide compound semiconductor material, preferably $In_xGa_yAl_{1-x-y}P$, where $0 \leq x \leq 1$, $0 \leq y \leq 1$ and $x+y \leq 1$. This material does not necessarily have to have a mathematically exact composition according to the above formula. Rather, it may contain one or more dopants and additional constituents. However, for simplicity's sake, the above formula contains only the essential components of the crystal lattice (In, Al, Ga, P), even if they may be partially replaced by small amounts of other substances. In particular, the semiconductor layer sequence comprises several layers of $In_xGa_yAl_{1-x-y}P$, where $0 \leq x \leq 1$, $0 \leq y \leq 1$ and $x+y \leq 1$.

The semiconductor layer sequence comprises in particular a p-type semiconductor region, an n-type semiconductor region and an active layer that emits electromagnetic radiation arranged between the p-type semiconductor region and the n-semiconductor region.

The active layer can, for example, be in the form of a pn-junction, a double heterostructure, a single quantum well structure or a multiple quantum well structure. The term quantum well structure covers any structure in which charge carriers experience a quantization of their energy states by confinement. In particular, the term quantum well structure contains no information about the dimensionality of the quantization. It includes quantum wells, quantum wires or quantum dots and any combination of these structures.

The optoelectronic semiconductor chip may contain a current spreading layer comprising a transparent conductive oxide adjacent to the p-type semiconductor region, and a metallic p-connection layer at least regionally adjoining the current spreading layer. The p-connection layer comprises a metal or metal alloy and is located on a side of the current spreading layer remote from the semiconductor layer sequence. The metallic p-connection layer in particular supplies current through a current spreading layer into the p-type semiconductor region, but it can also have the function of a mirror layer at the same time.

The p-type semiconductor region may have a p-contact layer adjacent to the current spreading layer, the p-contact layer comprising carbon (C) doped gallium phosphide (GaP). The p-contact layer is advantageously a highly doped layer, where the dopant concentration of carbon in the p-contact layer is at least $1*10^{19}$ cm$^{-3}$, preferably at least $5*10^{19}$ cm$^{-3}$. Furthermore, the p-contact layer is a comparatively thin layer preferably having a thickness of less than 100 nm.

The p-contact layer made of C-doped GaP can be advantageously very thin since C-doped GaP can be used to achieve good electrical contact with high conductivity. In particular, GaP can be produced with a comparatively high dopant concentration of C. Furthermore, the p-contact layer can be comparatively thin because it does not have to perform the function of current spreading. Rather, the current spreading in the light emitting diode chip is essentially caused by the current spreading layer made of the transparent conductive oxide arranged between the p-contact layer and the metallic p-connection layer.

The optoelectronic semiconductor chip with a thin GaP layer doped with C as the p-contact layer and a current spreading layer made of a transparent conductive oxide is characterized by particularly low absorption and improved moisture resistance.

The preferred C dopant concentration in the p-contact layer is more than $5*10^{19}$ cm$^3$. In particular, the C dopant concentration can have a value of $5*10^{19}$ cm$^{-3}$ to $1*10^{22}$ cm$^3$, e.g. about $5*10^{20}$ cm$^{-3}$. In this way, a particularly good electrical contact is established between the p-type semiconductor region and the current spreading layer.

Preferably, the thickness of the p-contact layer is 1 nm to 100 nm. Such a low thickness of the p-contact layer has the advantage that the absorption in the p-contact layer is particularly low. Preferably, the p-contact layer can be less than 50 nm or less than 35 nm thick.

Furthermore, it is possible that a p-contact layer with a low thickness is not relaxed or at least partially not relaxed. During epitaxial growth of the p-contact layer made of C-doped GaP on the underlying semiconductor layer, in particular an InGaAlP layer, the layer typically grows in a thickness range of up to a few nanometers initially with the lattice constant of the underlying semiconductor layer until it relaxes, i.e. the lattice constant corresponding to its material composition appears, in particular by formation of dislocations. In the thickness of 1 nm to 100 nm, the p-contact layer is advantageously not yet or at least predominantly not yet relaxed. The defect density and the surface roughness are therefore particularly low in this region. The rms surface roughness of the p-contact layer at the interface to the current spreading layer is advantageously less than 2 nm.

The current spreading layer and the p-contact layer may be regionally interrupted. This can be advantageous to reduce the current flow through a part of the optoelectronic semiconductor chip. In this way, the absorption in a metallic connection layer in particular can be reduced. In particular, the optoelectronic semiconductor chip may have an n-connection layer, the current spreading layer and the p-contact layer being interrupted in an area opposite the n-connection layer. In this way, less radiation is generated below the absorbing n-connection layer, thus reducing absorption losses.

A p-doped InGaAlP layer may be arranged on a side of the p-contact layer facing away from the current spreading layer. In particular, the p-doped InGaAlP layer can have an indium content of about 0.5, for example, the composition $In_{0.5}Ga_{0.22}Al_{0.28}P$. The InGaAlP layer can in particular be p-doped with magnesium and is preferably more than 50 nm thick.

The current spreading layer of the optoelectronic semiconductor chip comprises in at least one configuration indium tin oxide (ITO), indium zinc oxide (IZO) or zinc oxide (ZnO). These materials are advantageously transparent and exhibit good electrical conductivity. The thickness of the current spreading layer is preferably 10 nm to 300 nm, for example, about 60 nm. In this thickness range the absorption in the current spreading layer is advantageously low.

Preferably, the n-type semiconductor region faces a radiation exit surface of the optoelectronic semiconductor chip, and the p-type semiconductor region faces a carrier substrate of the optoelectronic semiconductor chip. Preferably, the optoelectronic semiconductor chip is a so-called thin-film light emitting diode chip in which a growth substrate used to grow the semiconductor layer sequence is detached from the optoelectronic semiconductor chip. The original growth substrate may be detached from the n-type semiconductor region of the semiconductor layer sequence in particular. At the side of the p-type semiconductor region opposite the original growth substrate, the optoelectronic semiconductor chip is preferably connected to a carrier, for example, by a solder connection. In this example, the carrier is different from a growth substrate of the semiconductor layer sequence and comprises, for example, silicon, molybdenum, germanium or a ceramic. In contrast to conventional LEDs in which the n-type semiconductor region usually faces the substrate and the p-type semiconductor region the radiation exit surface, the optoelectronic semiconductor chip in the form of a thin-film LED chip has the p-type semiconductor region facing the carrier and the n-type semiconductor region facing the radiation exit surface.

The p-connection layer may contain gold or silver. Gold and silver are characterized by high electrical conductivity and high reflectivity. A high reflectivity of the p-connection layer is particularly advantageous if the p-type semiconductor region faces the carrier of the optoelectronic semiconductor chip. In this example, the p-connection layer can deflect radiation emitted from the active layer in the direction of the carrier to a radiation exit surface of the optoelectronic semiconductor chip. It is possible that the p-connection layer has a thin adhesion promoter layer to improve adhesion, e.g. a thin layer of ITO or Ti.

Our chips will be explained in more detail in the following examples in connection with FIGS. 1 to 5.

Identical or similarly acting elements are provided in the figures with the same reference signs. The sizes of the individual elements as well as the proportions of the elements among each other are not to be regarded as true to scale.

The optoelectronic semiconductor chip 20 shown in FIG. 1 comprises a semiconductor layer sequence 10 with an n-type semiconductor region 2 and a p-type semiconductor region 4. An active layer 3 is arranged between the n-type semiconductor region 2 and the p-type semiconductor region 4.

The semiconductor layer sequence 10 is based on a phosphide compound semiconductor, i.e. one or more semiconductor layers contained in the semiconductor layer sequence 10 have $In_xGa_yAl_{1-x-y}P$ with $0 \leq x \leq 1$, $0 \leq y \leq 1$ and $x+y \leq 1$ in particular. In particular, one or more layers of the n-type semiconductor region 2, the active layer 3 and the p-type semiconductor region 4 are formed from phosphide compound semiconductor materials. However, it cannot be excluded that the semiconductor layer sequence 10 contains one or more layers of another III-V compound semiconductor material such as one or more arsenide compound semiconductor layers.

The semiconductor layer sequence 10, for example, is epitaxially grown on a growth substrate 1. The growth substrate 10 is, for example, a GaP substrate or a GaAs substrate.

The active layer 3 can in particular be a radiation-emitting layer. In particular, the active layer 3 may include a pn junction or preferably a single or multiple quantum well structure. For example, the optoelectronic semiconductor chip 20 is an LED chip or a semiconductor laser. Alternatively, it is also possible that the active layer 3 is a radiation-receiving layer and the optoelectronic semiconductor chip is a detector.

The p-type semiconductor region 4 can contain several p-doped semiconductor layers 5, 6, 7. However, it cannot be excluded that the p-type semiconductor region 4 contains one or more undoped layers. Accordingly, the n-type semiconductor region 2 may contain one or more n-doped layers and, if applicable, one or more undoped layers.

The p-type semiconductor region 4 has a p-contact layer 7 adjacent to a current spreading layer 8. The p-contact layer 7 is the outermost semiconductor layer on the p-side of the optoelectronic semiconductor chip 20.

The current spreading layer 8 contains a transparent conductive oxide, for example, ITO. Alternatively, the transparent conductive oxide can be ZnO or IZO. The current spreading layer 8 is adjacent to a p-connection layer 12 made of a metal or metal alloy. The p-connection layer 12 is used to establish an electrical contact to conduct an electrical current into the semiconductor layer sequence 10. For example, an n-connection layer 11 for electrical contacting from the n-side may be located on the back of the substrate 1 if an electrically conductive substrate 1 is used. Alternatively, other arrangements of the n-connection layer 11 are also possible, for example, the n-connection layer 11 can be arranged on an exposed area of the n-type semiconductor region 2 (not shown).

The current spreading layer 8 made of the transparent conductive oxide has the particular advantage that, due to its high transparency, it can be applied to the entire p-contact layer 7, resulting in good current spreading without significant absorption losses. The thickness of the current spreading layer 8 is preferably 10 nm to 300 nm, for example, about 60 nm.

The p-contact layer 7, at which the current spreading layer 8 is connected to the semiconductor layer sequence 10, is advantageously a C-doped GaP layer. A high dopant concentration can be advantageously achieved with the C-doping of GaP. The dopant concentration in the p-contact layer 7, for example, can be $1*10^{19}$ cm$^{-3}$ to $1*10^{22}$ cm$^{-3}$. The preferred dopant concentration in the p-contact layer 7 is more than $5*10^{19}$ cm$^{-3}$, for example, about $5*10^{20}$ cm$^{-3}$. Due to the high doping of the p-contact layer 7, a good electrical connection to the current spreading layer 8 is achieved.

The p-contact layer 7 is advantageously a thin layer, which is only less than 100 nm, preferably 1 nm to 35 nm thick. Such a small thickness of the p-contact layer 7 is particularly possible because the current spreading already takes place in the adjacent current spreading layer 8 comprising the transparent conductive oxide. The p-contact layer 7 made from C-doped GaP therefore does not have to be used for current spreading. In contrast to conventional light emitting diode chips in which one or more comparatively thick p-type semiconductor layers are generally used for current spreading, the very thin p-contact layer 7 has the advantage that absorption is only very low.

Furthermore, the thin p-contact layer 7 containing C-doped GaP has the advantage of low roughness. The rms surface roughness of the p-contact layer 7 at the interface to the current spreading layer 8 is advantageously less than 2 nm. The low roughness is made possible in particular by the low thickness, especially in the preferred thickness range of about 1 nm to 35 nm since the p-contact layer 7 is essentially not yet completely relaxed at such a low layer thickness. In other words, the p-contact layer 7 is grown strained on the underlying semiconductor layer 6, which is in particular a p-doped InGaAlP layer 6. A transition to the lattice constant of the GaP semiconductor material would only occur with a larger layer thickness due to formation of dislocations. The Ga content in the InGaAlP layer 6 is particularly advantageous in reducing ageing.

Furthermore, it is advantageous that the p-contact layer 7 is free of aluminium. A high aluminium content in the p-contact layer 7 in itself has the advantage that the absorption is low due to the large electronic band gap caused by the high aluminium content. On the other hand, a semiconductor layer with a high aluminum content is comparatively sensitive to moisture. Since absorption of the p-contact layer 7 is only very low due to the low layer thickness, the semiconductor material of the p-contact layer 7 can be advantageously free of aluminum without significant absorption occurring in the p-contact layer 7.

The doping of the p-contact layer 7 with carbon also has the advantage that diffusion of the conventionally used dopant magnesium into underlying semiconductor layers, in particular the active layer 3, does not occur. The problem of diffusion is less with the use of carbon as dopant than with the use of magnesium.

Figure 2:
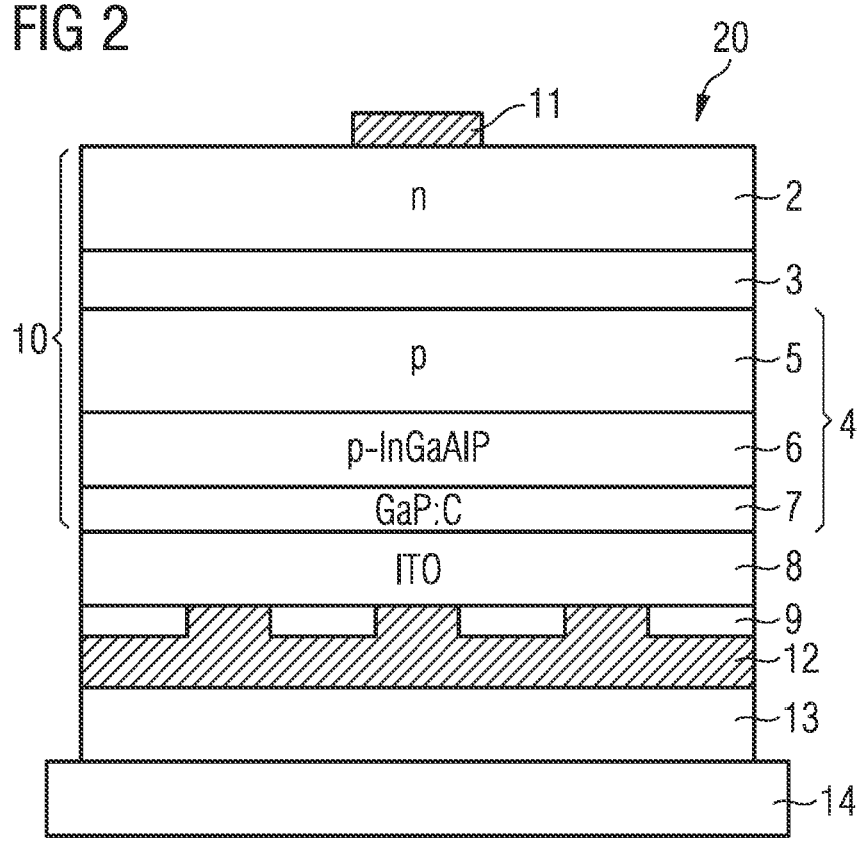
FIG. 2 shows a schematic representation of a cross-section through an optoelectronic semiconductor chip according to a second example.

The further example of the optoelectronic semiconductor chip 20 shown in FIG. 2 is a so-called thin-film LED in which the semiconductor layer sequence 10 is detached from its original growth substrate. The original growth substrate is detached from the n-type semiconductor region 2 that in this example is located at the radiation exit side of the optoelectronic semiconductor chip 20. On the side opposite the original growth substrate, the optoelectronic semiconductor chip 20 is applied to a carrier substrate 14 with at least one connection layer 13 such as a solder layer. Seen from the active layer 3, the p-type semiconductor area 4 with the p-contact layer 7 faces the carrier substrate 14. The carrier substrate 14 is not the same as the growth substrate used for the epitaxial growth of the semiconductor layer sequence 10. The carrier substrate 14 may, for example, comprise a semiconductor material such as silicon, germanium or molybdenum or a ceramic.

As in the above example, the p-contact layer 7 contains GaP doped with C and adjoins the current spreading layer 8 that contains a transparent conductive oxide such as ITO. The current spreading layer 8 directly adjoins the p-connection layer 12 regionally. The p-connection layer 12 is preferably a reflective layer to reflect the radiation emitted from the active zone 5 in the direction of the carrier substrate 14 to the opposing radiation exit surface at the surface of the n-type semiconductor region 2. The reflective p-connection layer 12 may in particular contain or consist of silver or gold. Silver and gold are characterized by a high reflectivity.

In the example, a dielectric layer 9 is arranged in some areas between the current spreading layer 8 and the p-connection layer 12 that can in particular be a silicon oxide layer. Due to the comparatively low refractive index of the dielectric material of the dielectric layer 9, for example, $SiO_2$ the dielectric layer 9 can cause a total reflection of part of the radiation emitted in the direction of the carrier substrate 14 towards the radiation exit surface. The reflective effect of the metallic p-connection layer 12 is therefore advantageously further enhanced by the dielectric layer 9. Since the dielectric layer 9 is not electrically conductive, the p-connection layer 12 connects to the current spreading layer 8 through one or more openings in the dielectric layer 9.

Further advantageous configurations and the resulting advantages of the second example correspond to the first example and are therefore not explained in detail.

Figure 3:
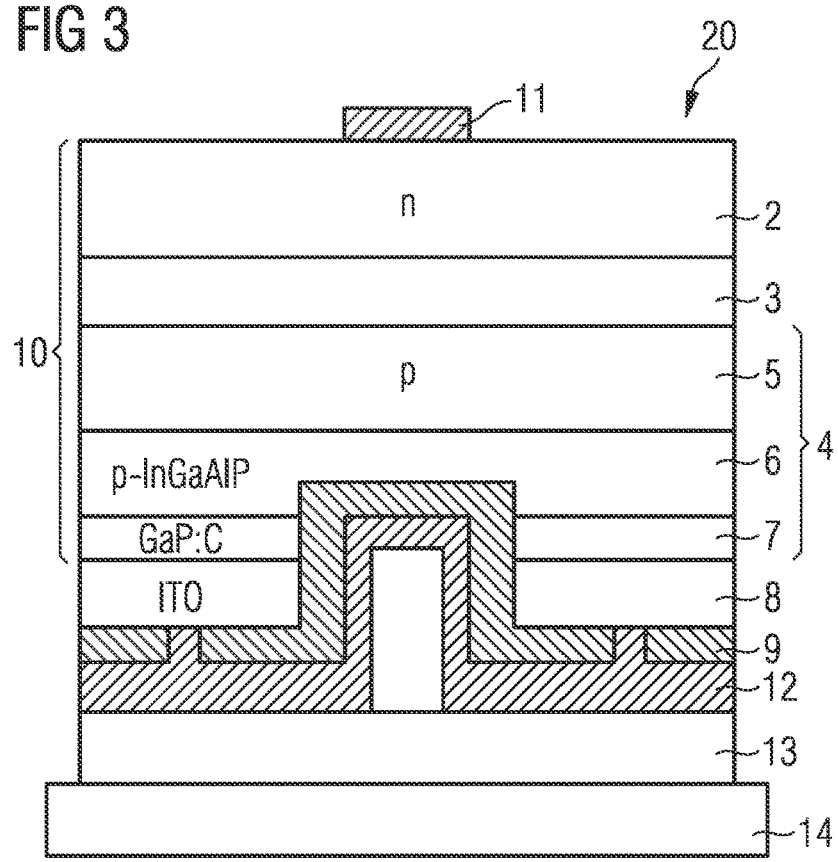
FIG. 3 shows a schematic representation of a cross-section through an optoelectronic semiconductor chip according to a third example.

The third example of an optoelectronic semiconductor chip 20 shown in FIG. 3 differs from the optoelectronic semiconductor chip 20 shown in FIG. 2 in that the p-contact layer 7 and the current spreading layer 8 are interrupted in an area opposite the n-connection layer 11. For this purpose, a recess is created in the current spreading layer 8 and the p-contact layer 7, for example, in the manufacture of the optoelectronic semiconductor chip before the dielectric layer 9 and the p-connection layer 12 are applied. This structuring takes place in particular before the growth substrate is detached and before the optoelectronic semiconductor chip is connected to the carrier 14. Partial removal of the current spreading layer 8 and the p-contact layer 7 in the region opposite the n-connection layer 11 has the particular advantage that the current flow through the active layer 3 in this region is reduced. In this way, less radiation is generated below the absorbing n-connection layer 11, thus reducing absorption losses.

In other respects, the execution example of FIG. 3 corresponds to the execution example shown in FIG. 2 with regard to its functionality and other advantageous configurations.

Figure 4:
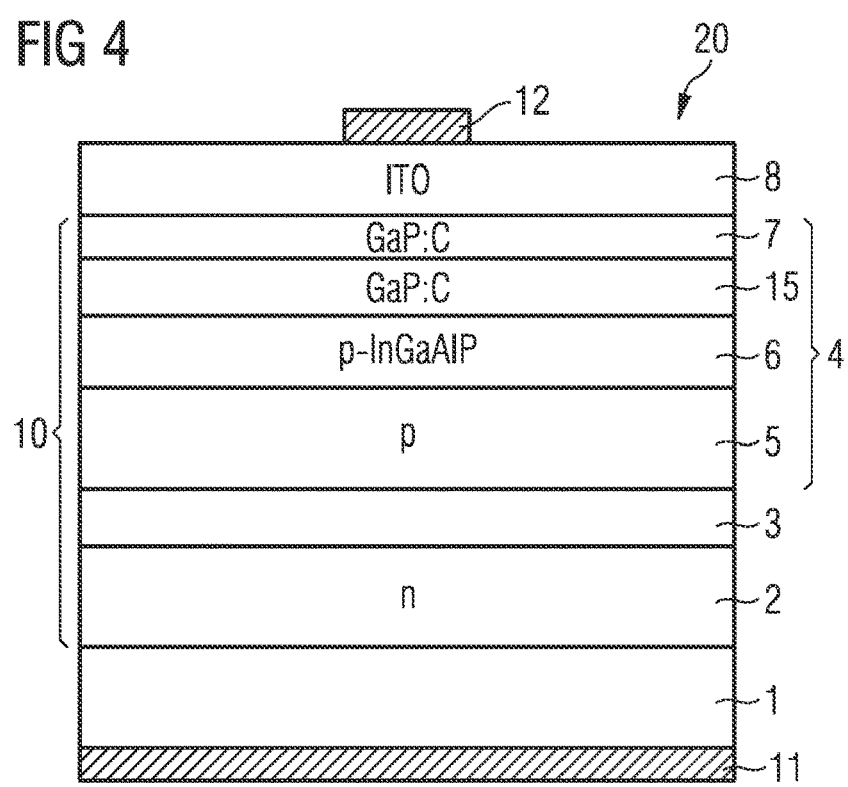
FIG. 4 shows a schematic representation of a cross-section through an optoelectronic semiconductor chip according to a fourth example.

FIG. 4 shows another example of the optoelectronic semiconductor chip 20. This example differs from the example in FIG. 1 in that an intermediate layer 15 is arranged on one side of the p-contact layer 7 facing away from the current spreading layer 8. The intermediate layer 15 in particular directly adjoins the side of the p-contact layer 7 facing away from the current spreading layer 8. The intermediate layer 15, for example, is 10 nm to 200 nm thick.

The intermediate layer 15 preferably comprises GaP doped with C like the p-contact layer 7, whereby the intermediate layer 15 has a lower dopant concentration than the p-contact layer 7. Preferably, the p-contact layer 7 has a C-dopant concentration of at least $1*10^{22}$ cm$^{-3}$. In this example, the intermediate layer 15 has a dopant concentration of less than $1*10^{22}$ cm$^{-3}$. The preferred dopant concentration in the intermediate layer 15 is more than $1*10^{19}$ cm$^3$, in particular between $1*10^{19}$ cm$^{-3}$ and $1*10^{22}$ cm$^{-3}$. The advantage of the intermediate layer 15 is that the spread of defects from the higher doped p-contact layer 7 is reduced. In other respects, the example in FIG. 4 corresponds to the example in FIG. 1 with regard to its functionality and other advantageous configurations.

Figure 5:
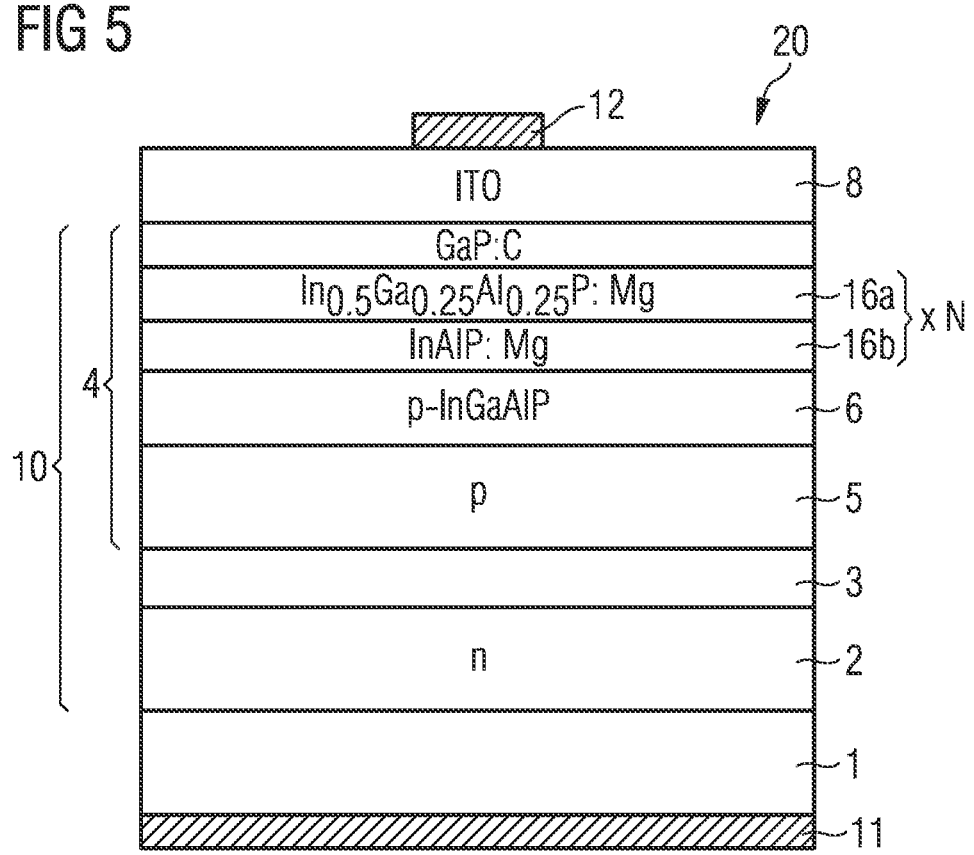
FIG. 5 shows a schematic representation of a cross-section through an optoelectronic semiconductor chip according to a fifth example.

FIG. 5 shows another example of the optoelectronic semiconductor chip 20. This example differs from the example in FIG. 1 in that a superlattice 16a, 16b comprising alternating first layers 16a and second layers 16b is arranged on a side of the p-contact layer 7 remote from the current spreading layer 8. In particular, the superlattice 16a, 16b is directly adjacent to the side of the p-contact layer 7 facing away from the current spreading layer 8. In particular, the superlattice 16a, 16b is a periodic layer sequence comprising N periods with a first layer 16a and a second layer 16b each. The number of periods N of the superlattice is preferably more than 3, for example, about 20. The superlattice 16a, 16b has in particular the advantage that the propagation of defects from the p-contact layer 7 which is doped with C is reduced. It is also possible that below the p-contact layer 7 both the less doped intermediate layer made of GaP:C of the previous example and the superlattice 16a, 16b are arranged.

The superlattice 16a, 16b preferably comprises first layers 16a with the composition $In_{0.5}Ga_xAl_{0.5-x}P$ and second layers 16b with the composition $In_{0.5}Ga_yAl_{0.5-y}P$. It preferably applies here $(x-y)/x>0.05$. For example, $x=0.25$ and $y=0$. Due to the different material compositions, the first layers 16a and second layers 16b can be strained against each other, for example, in the range up to ±3000 ppm. For example, the first layers 16a and the second layers 16b of the superlattice are between 5 nm and 200 nm thick.

In all other respects, the example of FIG. 5 corresponds to the example of FIG. 1 with regard to its functionality and other advantageous configurations. It is, of course, also possible to apply the characteristics of the examples in FIGS. 4 and 5 to optoelectronic semiconductor chips with reversed polarity as shown in FIGS. 2 and 3.

Our chips are not limited by the description of the examples. Rather, this disclosure includes each new feature and each combination of features, which in particular includes each combination of features in the appended claims, even if the feature or combination itself is not explicitly stated in the claims or examples.

This application claims priority of DE 10 2017 101 637.6, the subject matter of which is incorporated herein by reference.

The invention claimed is:
1. An optoelectronic semiconductor chip comprising:
a semiconductor layer sequence comprising a phosphide compound semiconductor material, wherein the semiconductor layer sequence includes a p-type semiconductor region, an n-type semiconductor region and an active layer disposed between the p-type semiconductor region and the n-type semiconductor region, a current spreading layer comprising a transparent conductive oxide adjoining the p-type semiconductor region, and a metallic p-connection layer at least regionally adjoining the current spreading layer, wherein the p-type semiconductor region comprises a p-contact layer adjoining the current spreading layer, the p-contact layer comprises GaP doped with C, a C dopant concentration in the p-contact layer is at least $1 * 10^{20}$ cm$^{-3}$, the p-contact layer has a thickness of less than 35 nm, an intermediate layer comprising GaP doped with C is arranged on a side of the p-contact layer remote from the current spreading layer, the intermediate layer having a lower dopant concentration than the p-contact layer, and the active layer includes at least one layer comprising $In_xGa_yAl_{1-x-y}$ P with 0≤x≤1, 0≤y≤1 and x+y≤1.

2. The optoelectronic semiconductor chip according to claim 1, wherein the p-contact layer has a thickness of 1 nm to 100 nm.

3. The optoelectronic semiconductor chip according to claim 1, wherein the p-contact layer has a thickness of less than 50 nm.

4. The optoelectronic semiconductor chip according to claim 1, wherein the current spreading layer and the p-contact layer are regionally interrupted.

5. The optoelectronic semiconductor chip according to claim 4, wherein the optoelectronic semiconductor chip has an n-connection layer, and the current spreading layer and the p-contact layer are interrupted in a region opposite the n-connection layer.

6. The optoelectronic semiconductor chip according to claim 1, wherein the p-contact layer has an rms surface roughness of less than 2 nm.

7. The optoelectronic semiconductor chip according to claim 1, wherein a p-doped InAlGaP layer is arranged on a side of the p-contact layer remote from the current spreading layer.

8. The optoelectronic semiconductor chip according to claim 1, wherein the current spreading layer comprises ITO, ZnO or IZO.

9. The optoelectronic semiconductor chip according to claim 1, wherein the current spreading layer has a thickness of 10 nm to 300 nm.

10. The optoelectronic semiconductor chip according to claim 1, wherein the n-type semiconductor region faces a radiation exit surface of the optoelectronic semiconductor chip, and the p-type semiconductor region faces a carrier substrate of the optoelectronic semiconductor chip.

11. The optoelectronic semiconductor chip according to claim 1, wherein the p-connection layer comprises gold or silver.

12. The optoelectronic semiconductor chip according to claim 1, wherein a superlattice comprising alternating first layers and second layers is arranged on a side of the p-contact layer remote from the current spreading layer.

13. The optoelectronic semiconductor chip according to claim 12, wherein the superlattice is a periodic layer sequence comprising N periods, and the number of periods N of the superlattice is more than 3.

14. The optoelectronic semiconductor chip according to claim 12, wherein the first layers and the second layers of the superlattice are 5 nm to 200 nm thick.

15. The optoelectronic semiconductor chip according to claim 1, wherein a dielectric layer is arranged regionally between the current spreading layer and the p-connection layer, and the p-connection layer connects to the current spreading layer through one or more openings in the dielectric layer.

16. The optoelectronic semiconductor chip according to claim 1, wherein the intermediate layer has a dopant concentration of more than $1 * 10^{19}$ cm$^{-3}$.

17. The optoelectronic semiconductor chip according to claim 1, wherein the intermediate layer is 10 nm to 200 nm thick.

18. The optoelectronic semiconductor chip according to claim 1, wherein the p-contact layer has an rms surface roughness of less than 2 nm, and wherein a p-doped InAlGaP layer is arranged on a side of the p-contact layer remote from the current spreading layer.

* * * * *